(12) United States Patent
Yang et al.

(10) Patent No.: US 11,587,846 B2
(45) Date of Patent: Feb. 21, 2023

(54) SEMICONDUCTOR DEVICE AND METHOD OF FORMING THE SAME

(71) Applicants: MEDIATEK INC., Hsinchu (TW); Chee-Wee Liu, Taipei (TW)

(72) Inventors: Ming-Tzong Yang, Hsinchu (TW); Hsien-Hsin Lin, Hsinchu (TW); Wen-Kai Wan, Hsinchu (TW); Chia-Che Chung, Hsinchu (TW); Chee-Wee Liu, Taipei (TW)

(73) Assignees: MEDIATEK INC., Hsinchu (TW); Chee-Wee Liu, Taipei (TW)

( * ) Notice: Subject to any disclaimer, the term of this patent is extended or adjusted under 35 U.S.C. 154(b) by 0 days.

(21) Appl. No.: 17/133,896

(22) Filed: Dec. 24, 2020

(65) Prior Publication Data
US 2022/0059429 A1    Feb. 24, 2022

Related U.S. Application Data

(60) Provisional application No. 63/067,901, filed on Aug. 20, 2020.

(51) Int. Cl.
*H01L 23/373* (2006.01)
*H01L 21/768* (2006.01)
(Continued)

(52) U.S. Cl.
CPC .......... *H01L 23/373* (2013.01); *H01L 21/768* (2013.01); *H01L 29/66795* (2013.01); *H01L 29/785* (2013.01); *H01L 2029/7858* (2013.01)

(58) Field of Classification Search
CPC .............. H01L 23/373; H01L 29/785; H01L 2029/7858; H01L 29/42392; H01L 29/66795; H01L 23/345
See application file for complete search history.

(56) References Cited

U.S. PATENT DOCUMENTS

| | | | | |
|---|---|---|---|---|
| 8,617,927 | B1 * | 12/2013 | Margomenos | H01L 23/42 257/713 |
| 2006/0174823 | A1 * | 8/2006 | Sung | H03H 3/08 117/84 |

(Continued)

FOREIGN PATENT DOCUMENTS

| | | |
|---|---|---|
| TW | 200836596 A | 9/2008 |
| TW | 201826482 A | 7/2018 |

OTHER PUBLICATIONS

Chinese language office action dated Aug. 10, 2022, issued in application No. TW 110130588.

*Primary Examiner* — Changhyun Yi
(74) *Attorney, Agent, or Firm* — McClure, Qualey & Rodack, LLP (57) ABSTRACT

A semiconductor device includes a heat dissipation substrate and a device layer. The thermal conductivity of the heat dissipation substrate is greater than 200 $Wm^{-1}K^{-1}$ and the device layer is disposed on the heat dissipation substrate. The device layer includes a transistor. A method of forming a semiconductor device includes providing a base substrate, forming a heat dissipation substrate on the base substrate, wherein a thermal conductivity of the heat dissipation substrate is greater than 200 $Wm^{-1}K^{-1}$. The method further includes forming a device layer on the heat dissipation substrate, wherein the device layer comprises a transistor. The method further includes removing the base substrate.

20 Claims, 5 Drawing Sheets

(51) Int. Cl.
*H01L 29/78* (2006.01)
*H01L 29/66* (2006.01)

(56) References Cited

U.S. PATENT DOCUMENTS

| | | | |
|---|---|---|---|
| 2008/0144291 A1* | 6/2008 | Hu | H05K 1/053 361/720 |
| 2015/0084128 A1* | 3/2015 | Gambino | H01L 21/283 257/347 |
| 2015/0311138 A1* | 10/2015 | Lee | H01L 27/1211 257/347 |
| 2021/0375715 A1* | 12/2021 | Kwon | H01L 24/32 |
| 2021/0407927 A1* | 12/2021 | Salmon | H01L 23/49838 |

\* cited by examiner

SEMICONDUCTOR DEVICE AND METHOD OF FORMING THE SAME

CROSS REFERENCE TO RELATED APPLICATIONS

This application claims the benefit of U.S. Provisional Application No. 63/067,901 filed on Aug. 20, 2020, the entirety of which is incorporated by reference herein.

BACKGROUND

Field of the Disclosure

The present disclosure relates to a semiconductor device, and in particular, to a semiconductor device with a substrate having high thermal conductivity.

Description of the Related Art

Semiconductor devices can be applied in various fields, such as smart TVs, voice assistant devices (VAD), tablets, feature phones, smartphones, optical and Blu-ray DVD players, and so on. Semiconductor devices are typically manufactured in the following manner: sequentially depositing an insulation or dielectric layer, a conductive layer, and a semiconductor material layer on a semiconductor substrate, and patterning the various material layers by using lithography and etching technique to forming circuit components and elements thereon.

During developments in an effort to continue the scaling-down process of semiconductor devices, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also been accompanied by increased complexity in design and manufacturing of transistors (e.g. non-planar transistor) in devices. Parallel advances in manufacturing have allowed increasingly complex designs to be fabricated with precision and reliability.

However, numerous challenges have arisen in the effort to continue the scaling-down of semiconductor devices. For example, heat may be generated from non-planar transistors or other features in semiconductor devices, resulting in heat dissipation issue. Therefore, heat dissipation is required for semiconductor devices to prevent thermal damage and to improve device reliability. Although existing methods of heat dissipation for semiconductor devices have been generally adequate for their intended purposes, they have not been entirely satisfactory in all respects.

SUMMARY

Some embodiments of the present disclosure provide semiconductor device and method of forming the same. An embodiment of the present disclosure provides a semiconductor device, which includes a heat dissipation substrate and a device layer. The thermal conductivity of the heat dissipation substrate is greater than 200 $Wm^{-1}K^{-1}$ and the device layer is disposed on the heat dissipation substrate. The device layer includes a transistor.

In an exemplary embodiment, the thermal conductivity of the heat dissipation substrate is between 200 $Wm^{-1}K^{-1}$ and 1200 $Wm^{-1}K^{-1}$.

In an exemplary embodiment, the heat dissipation substrate includes a dielectric material.

In an exemplary embodiment, the dielectric material includes BeO, BN, diamond, or a combination thereof.

In an exemplary embodiment, the thickness of the heat dissipation substrate is between 75 µm and 150 µm.

In an exemplary embodiment, the device layer is a silicon transistor layer.

In an exemplary embodiment, the silicon transistor layer includes fin-like field effect transistor (FinFET), gate-all-around (GAA) transistor, or a combination thereof.

In an exemplary embodiment, the semiconductor device further includes an interconnection layer disposed on the device layer.

Another embodiment of the present disclosure provides a method of forming a semiconductor device, which includes providing a base substrate, forming a heat dissipation substrate on the base substrate, forming a device layer on the heat dissipation substrate, and removing the base substrate. The thermal conductivity of the heat dissipation substrate is greater than 200 $Wm^{-1}K^{-1}$. The device layer includes a transistor.

In an exemplary embodiment, forming the heat dissipation substrate on the base substrate includes performing a CVD process to form a dielectric material layer.

In an exemplary embodiment, the method further includes forming an interconnection layer on the device layer.

In an exemplary embodiment, removing the base substrate includes performing a grinding process on the base substrate.

In an exemplary embodiment, the base substrate is completely removed after the grinding process.

Yet another embodiment of the present disclosure provides a method of forming a semiconductor device, which includes providing a base substrate, forming a device layer on the base substrate, removing the base substrate, and attaching the device layer to a heat dissipation substrate. The thermal conductivity of the heat dissipation substrate is greater than 200 $Wm^{1}K^{-1}$. The device layer includes a transistor.

In an exemplary embodiment, removing the base substrate includes holding the device layer with a carrier and performing a grinding process to remove the base substrate completely.

In an exemplary embodiment, the carrier holds the device layer while the device layer is being attached to the heat dissipation substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean±20% of the stated value, or ±10% of the stated value, or ±5% of the stated value, or ±3% of the stated value, or ±2% of the stated value, or ±1% of the stated value, or ±0.5% of the stated value. The stated value of the present disclosure is an approximate value. When there is no specific description, the stated value includes the meaning of "about", "approximately", and "roughly". The terminology used herein is for the purpose of describing particular embodiments only and is not intended to limit the invention. As used herein, the singular terms "a," "an" and "the" are intended to include the plural forms as well, unless the context clearly indicates otherwise.

Some embodiments of the disclosure are described below. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Some embodiments of the present disclosure provide a semiconductor device, where a device layer is disposed on a heat dissipation substrate such that the heat dissipation substrate can dissipate heat generated by the device layer or other features in the semiconductor device. This can improve self-heating dissipation in the semiconductor device. Some embodiments of the present disclosure are preferably applied to devices with FinFETs or gate-all-around (GAA) transistors for improving heat dissipation. In such embodiments, heat generated from FinFETs or GAA transistors of the device layer or other features in the semiconductor device may be dissipated through the heat dissipation substrate, thereby improving heat dissipation in the semiconductor device.

Figure 1:
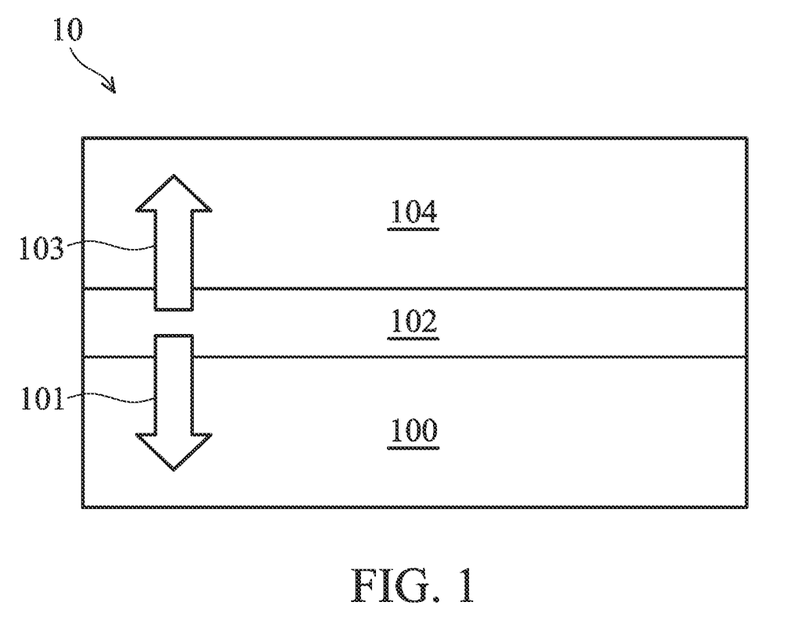
FIG. 1 illustrates a schematic cross-sectional view of a semiconductor device, in accordance with some embodiments of the present disclosure.

Referring to FIG. 1, a schematic cross-sectional view of the semiconductor device 10 is illustrated in accordance with some embodiments of the present disclosure. The semiconductor device 10 includes a heat dissipation substrate 100 and a device layer 102 disposed on the heat dissipation substrate 100. The thermal conductivity of the heat dissipation substrate 100 is greater than 200 $Wm^{-1}K^{-1}$. In some embodiments, the thermal conductivity of the heat dissipation substrate 100 is between 200 $Wm^{-1}K^{-1}$ and 1200 $Wm^{-1}K^{-1}$. For example, the thermal conductivity of the heat dissipation substrate 100 may be in a range between 280 $Wm^{-1}K^{-1}$ and 1000 $Wm^{-1}K^{-1}$ or between 800 $Wm^{-1}K^{-1}$ and 1200 $Wm^{-1}K^{-1}$. The material of the heat dissipation substrate 100 may include a dielectric material. For example, the dielectric material may include BeO, BN, diamond, another suitable material with a thermal conductivity of greater than 200 $Wm^{-1}K^{-1}$, or a combination thereof. In some embodiments, the dielectric material may be buried oxide (BOX). The dielectric material may be formed by chemical vapor deposition (CVD), atomic layer deposition (ALD), spin coating, epitaxial growth, another suitable method, or a combination thereof. In some embodiments, the thickness of the heat dissipation substrate 100 is between 75 μm and 150 μm. If the heat dissipation substrate 100 is too thin, such as less than 25 it may fail to support the features (such as the device layer 102) to be formed thereon and lead to substrate curl or even substrate crack. On the other hand, if the heat dissipation substrate 100 is too thick, such as greater than 300 μm, the improvement of heat dissipation may be insufficient.

The device layer 102 may include an active device, a passive device, or a combination thereof. For example, the active device may include a diode, a transistor (such as field effect transistor (FET), metal-oxide-semiconductor FET (MOSFET), bipolar junction transistor (BJT), insulated gate bipolar transistor (IGBT), lateral insulated gate bipolar transistor (LIGBT)), silicon controlled rectifier (SCR), or a combination thereof. The passive device may include a resistor, a capacitor, an inductor, a transformer, or a combination thereof. In some embodiments, the device layer 102 may include a silicon layer, a gate structure on the silicon layer, and a source/drain structure. According to some embodiments of the present disclosure, the device layer 102 may include non-planar transistors such as fin-like field effect transistor (FinFET), gate-all-around (GAA) transistor, or a combination thereof. During operation of the semiconductor device 10, the device layer 102 may generate heat, which may cause thermal damage and deteriorate device performance. Compared to conventional semiconductor device, where a substrate is formed of silicon such that heat can hardly be dissipated through the substrate, some embodiments of the present disclosure provide the heat dissipation substrate 100 that can efficiently dissipate heat generated by the device layer 102. As shown in FIG. 1, heat flow 101 represents heat flows from the device layer 102 to the heat dissipation substrate 100. It should be noted that the vertical direction of the heat flow 101 is for illustration purpose only, the heat flow may have a slanting direction. The heat dissipation substrate 100 may improve self-heating dissipation in the semiconductor device and improve reliability of the semiconductor device. Furthermore, in conventional semiconductor device, the silicon substrate may be thinned in order to dissipate heat. However, the heat dissipation through the thinned silicon substrate is insufficient and the thinned silicon substrate may result in substrate curl. By contrast, in some embodiments of the present disclosure, the heat dissipation substrate 100 can efficiently dissipate heat and have a suitable thickness to avoid substrate curl.

Still referring to FIG. 1, in some embodiments, semiconductor device 10 further includes an interconnection layer 104 disposed on the device layer 102. The interconnection layer 104 may include a dielectric layer on the device layer 102 and contact(s) penetrating through dielectric layer and in contact with the device layer 102. The dielectric layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof, and may be formed by CVD, ALD, spin coating, another suitable method, or a combination thereof. The contact(s) may include conductive material such as metal.

In embodiments where the semiconductor device 10 including the interconnection layer 104, heat generated by the device layer 102 may be dissipated through both the heat dissipation substrate 100 and the interconnection layer 104. Compared to conventional semiconductor device, where heat can only be dissipated through an interconnection layer and hardly dissipated through the substrate, some embodiments of the present disclosure provide the semiconductor device 10 having the heat dissipation substrate 100 such that heat may be dissipated through both the heat dissipation substrate 100 and the interconnection layer 104, as the illustrated heat flows 101 and 103 in FIG. 1. As such, the heat dissipation substrate 100 can improve the efficiency of heat dissipation and device reliability.

Figure 2:
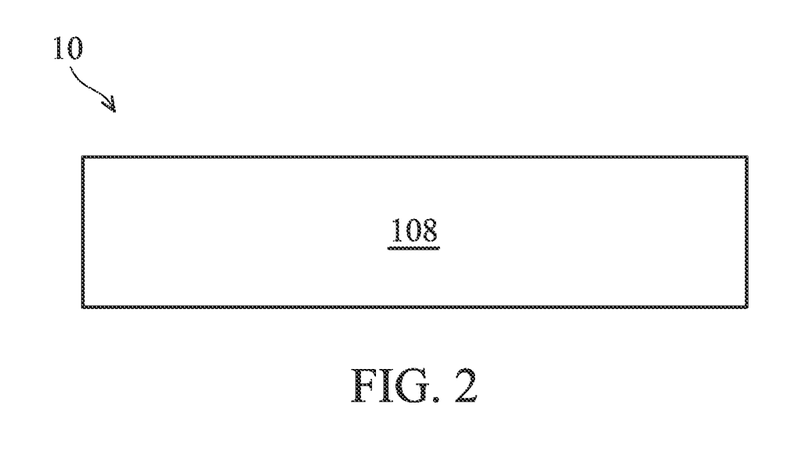
FIGS. 2-7 illustrate schematic cross-sectional views of a semiconductor device during fabrication processes, in accordance with some embodiments of the present disclosure.

FIGS. 2-7 illustrate schematic cross-sectional views of the semiconductor device 10 during fabrication processes, in accordance with some embodiments of the present disclosure. As shown in FIG. 2, a base substrate 108 is provided. In some embodiments, the base substrate 108 is a bulk semiconductor substrate, such as a semiconductor wafer. For example, the base substrate 108 includes silicon or other elementary semiconductor materials such as germanium. In some embodiments, the base substrate 108 includes an epitaxially grown semiconductor layer. The epitaxially grown semiconductor layer may be made of silicon germanium, silicon, germanium, one or more other suitable materials, or a combination thereof. In some other embodiments, the base substrate 108 includes a multi-layered structure. For example, the base substrate 108 includes a silicon-germanium layer formed on a bulk silicon layer. In some embodiments, the base substrate 108 may be a semiconductor-on-insulator substrate, such as a silicon-on-insulator (SOI) substrate.

Figure 3:
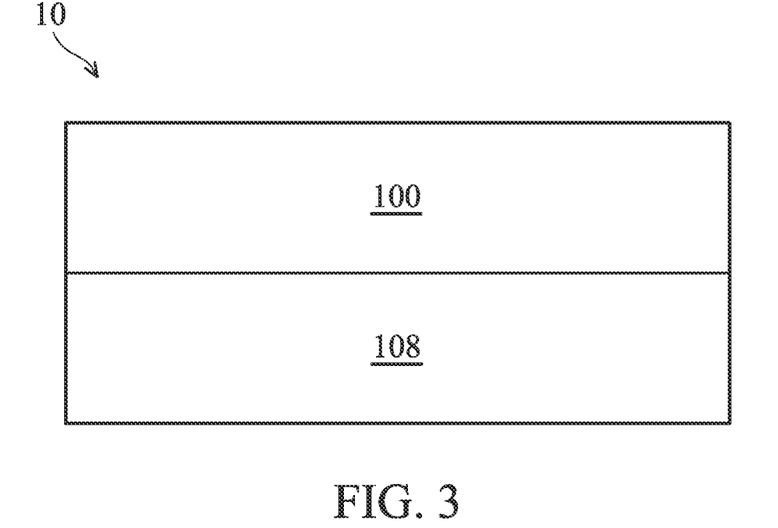

Referring to FIG. 3, a heat dissipation substrate 100 is formed on the base substrate 108. The thermal conductivity of the heat dissipation substrate 100 is greater than 200 $Wm^{-1}K^{-1}$. In some other embodiments, the thermal conductivity of the heat dissipation substrate 100 is between 200 $Wm^{-1}K^{-1}$ and 1200 $Wm^{-1}K^{-1}$. The material of the heat dissipation substrate 100 may include BeO, BN, diamond, another suitable material with a thermal conductivity of greater than 200 $Wm^{-1}K^{-1}$, or a combination thereof. The heat dissipation substrate 100 may be formed by performing a CVD or ALD process. For example, in some embodiments where the heat dissipation substrate 100 is formed of diamond in a CVD process, a carbon-containing precursor such as methyl radicals and/or acetylene may be used during the CVD process. In some other embodiments where the heat dissipation substrate 100 is formed of BeO in a CVD process, a beryllium-containing precursor such as dimethyl beryllium may be used during the CVD process. In some embodiments, the heat dissipation substrate 100 is formed to have a thickness that is between 75 μm and 150 μm. In some alternative embodiments, a bonding process may be performed to bond the base substrate 108 to a pre-formed heat dissipation substrate 100.

Figure 4:
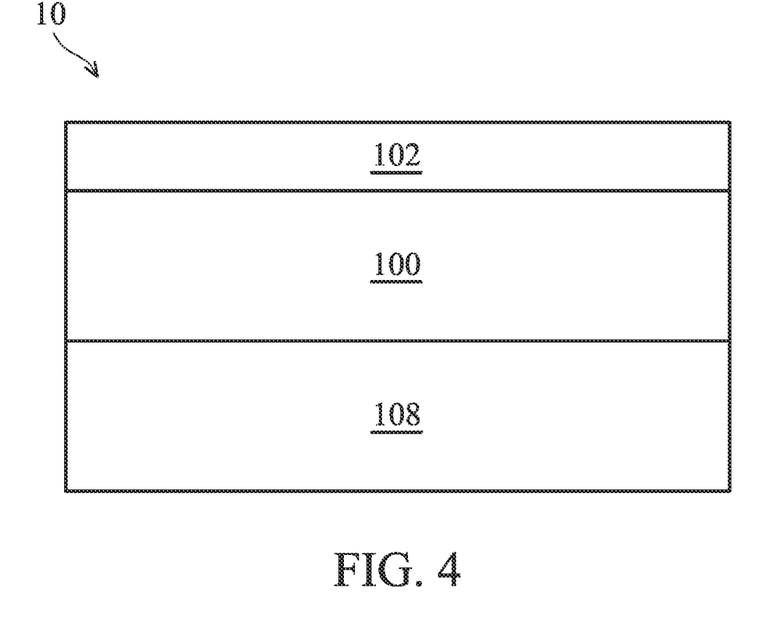
Figure 5:
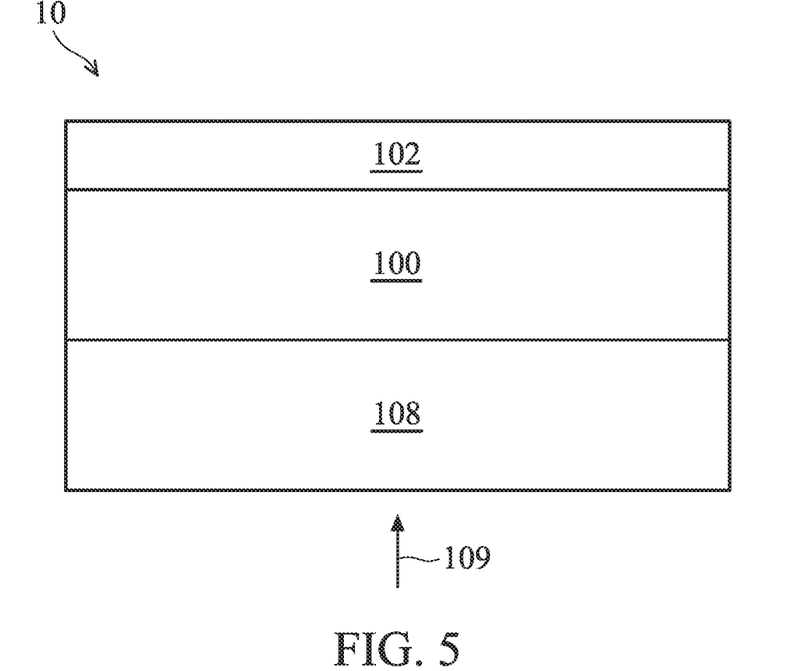
Figure 6:
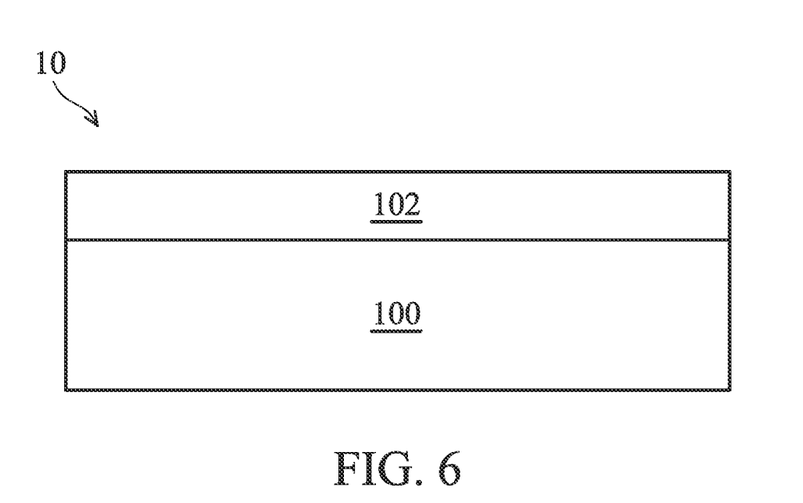

Referring to FIG. 4, a device layer 102 is formed on the heat dissipation substrate 100. The device layer 102 may include an active device, a passive device, or a combination thereof. In some embodiments, the device layer 102 may include FinFET, GAA transistor, other types of transistors, or a combination thereof. The base substrate 108 is subsequently removed in a removal process 109, as shown in FIGS. 5 and 6. In some embodiments, the removal process 109 may be a grinding process performed on the backside of the base substrate 108. According to some embodiments of the present disclosure, the base substrate 108 is completely removed after the grinding process. As described above, the heat dissipation substrate 100 can dissipate heat generated by the device layer 102 or other features in the semiconductor device 10.

Figure 7:
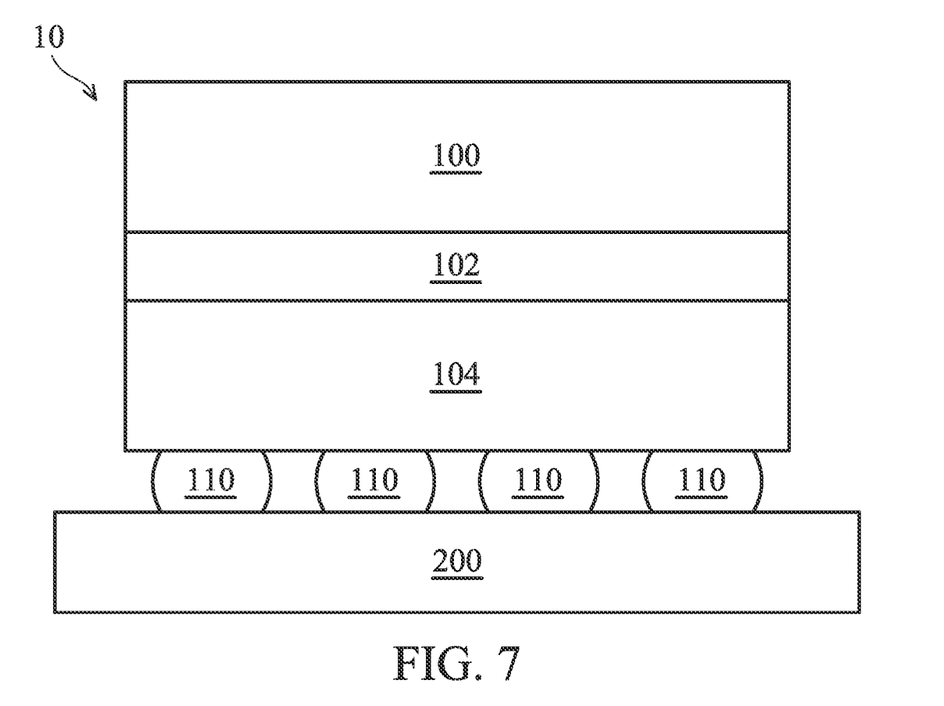

In some further embodiments, an interconnection layer 104 is formed on the device layer 102, as shown in FIG. 1. The interconnection layer 104 may be formed by subtractive etching of a blanket metal layer or may be formed by a damascene process. The damascene process may include (but not limited to) depositing a dielectric material layer on the device layer 102, patterning the dielectric material layer to form opening(s) exposing the device layer 102, filling the opening(s) with a conductive material, and performing a planarization process to remove excess conductive material. The dielectric material layer may be formed of silicon oxide, silicon oxynitride, BSG, PSG, BPSG, FSG, low-k material, porous dielectric material, one or more other suitable dielectric materials, or a combination thereof, and may be formed by CVD, ALD, spin coating, another suitable method, or a combination thereof. The conductive material may be formed of metal, such as Al, Cu, W, or alloys thereof. The semiconductor device 10 may be mounted on or be attached to another substrate 200. The substrate 200 may be a printed circuit board (PCB) or may be similar to the base substrate 108 described above. In some embodiments where the substrate 200 is a PCB, as shown in FIG. 7, the interconnection layer 104 of the semiconductor device 10 is soldered to the PCB through the solder bumps 110. In other embodiments where the substrate 200 is similar to the base substrate 108, the semiconductor device 10 is attached to the substrate 200 by, for example, wafer bonding technique.

Figure 8:
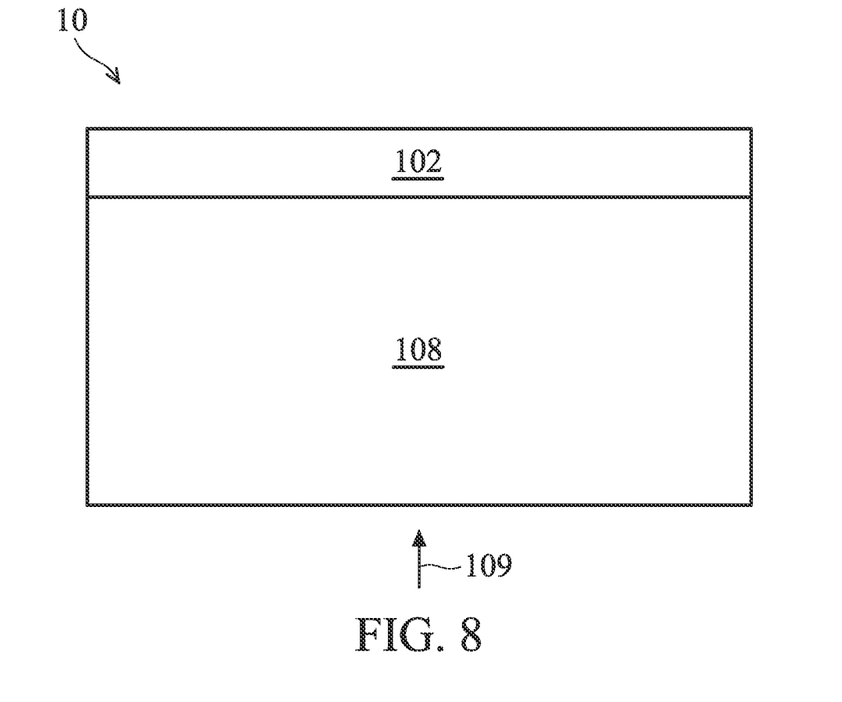
FIGS. 8-10 illustrate schematic cross-sectional views of a semiconductor device during fabrication processes, in accordance with other embodiments of the present disclosure.
Figure 9:
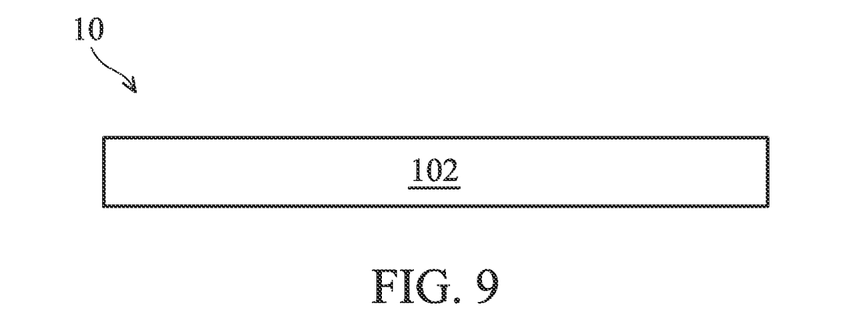
Figure 10:
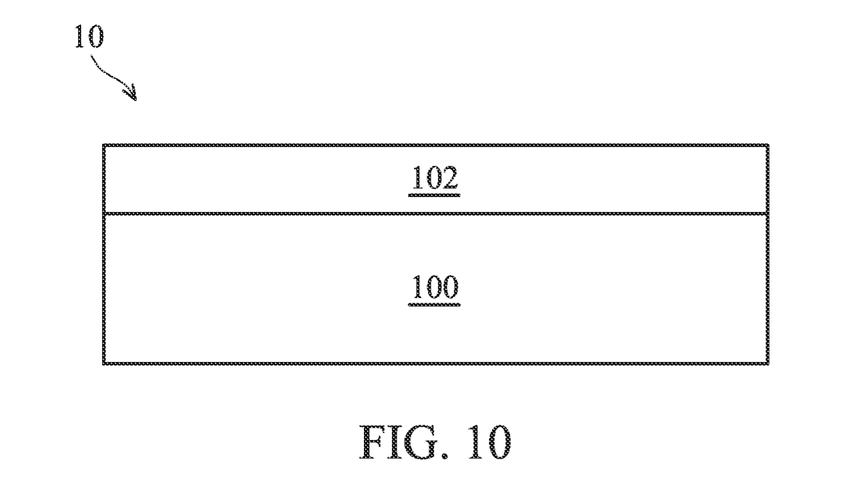

FIGS. 8-10 illustrate schematic cross-sectional views of a semiconductor device during fabrication processes, in accordance with other embodiments of the present disclosure. For simplicity, like features in FIGS. 8-10 and the figures described above are designated with like reference numerals and some description is not repeated. Referring to FIGS. 8 and 9, a base substrate 108 is provided and a device layer 102 is formed on the base substrate 108. The base substrate 108 is then removed in a removal process 109. The device layer 102 shown in FIG. 9 is then attached to a heat dissipation substrate 100 after the base substrate 108 is removed, thereby forming the semiconductor 10 as shown in FIG. 10. In some embodiments, the method of removing the base substrate 108 includes holding the device layer 102 with a carrier, such as an electrostatic chuck (e-chuck), and performing the removal process 109 to remove the base substrate 108 completely. In such embodiments, the carrier may hold the device layer 102 while the device layer 102 is being attached to the heat dissipation substrate 100. In some alternative embodiments, the base substrate 108 is partially removed by the removal process 109 so that a portion of the base substrate 108 remains underlying the device layer 102. For example, the thickness of the remaining base substrate 108 may be in a range between 10 µm to 20 µm.

The embodiments of the present disclosure provide many benefits to a semiconductor device and the formation thereof. According to some embodiments of the present disclosure, a semiconductor device with a heat dissipation substrate can dissipate heat generated in the semiconductor device and prevent thermal damage. In addition, substrate curl can be improved by the heat dissipation substrate 100 provided herein. In some embodiments, the semiconductor device having the heat dissipation substrate can dissipate heat through both the heat dissipation substrate and the interconnection layer, which can improve the efficiency of heat dissipation and device reliability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device mounted on a printed circuit board through solder bumps, comprising:
   a heat dissipation substrate, wherein a thermal conductivity of the heat dissipation substrate is greater than 200 $Wm^{-1}K^{-1}$;
   a device layer disposed on the heat dissipation substrate, wherein the device layer comprises a transistor; and
   an interconnection layer disposed on the device layer opposite to the heat dissipation substrate, wherein the interconnection layer is soldered to the printed circuit board through the solder bumps, such that the heat dissipation substrate is separated from the printed circuit board by the device layer and the interconnection layer, wherein opposite sidewalls of the heat dissipation substrate are aligned to opposite sidewalls of the device layer, and the opposite sidewalls of the device layer are aligned to opposite sidewalls of the interconnection layer in a cross-sectional view.

2. The semiconductor device as claimed in claim 1, wherein the thermal conductivity of the heat dissipation substrate is between 200 $Wm^{-1}K^{-1}$ and 1200 $Wm^{-1}K^{-1}$.

3. The semiconductor device as claimed in claim 1, wherein the heat dissipation substrate comprises a dielectric material.

4. The semiconductor device as claimed in claim 3, wherein the dielectric material comprises BeO, BN, diamond, or a combination thereof.

5. The semiconductor device as claimed in claim 1, wherein a thickness of the heat dissipation substrate is between 75 µm and 150 µm.

6. The semiconductor device as claimed in claim 1, wherein the device layer is a silicon transistor layer.

7. The semiconductor device as claimed in claim 6, wherein the silicon transistor layer comprises a fin-like field effect transistor, a gate-all-around transistor, or a combination thereof.

8. The semiconductor device as claimed in claim 1, wherein heat generated by the device layer is dissipated through the heat dissipation substrate and away from the device layer in a first direction, and the heat generated by the device layer is dissipated through the interconnection layer and away from the device layer in a second direction opposite to the first direction.

9. A method of forming a semiconductor device mounted on a printed circuit board through solder bumps, comprising:
   providing a base substrate;
   forming a heat dissipation substrate on the base substrate, wherein a thermal conductivity of the heat dissipation substrate is greater than 200 $Wm^{-1}K^{-1}$;
   forming a device layer on the heat dissipation substrate opposite to the base substrate after forming the heat dissipation substrate on the base substrate, wherein the device layer comprises a transistor;
   removing the base substrate only from a surface the heat dissipation substrate opposite to the device layer;
   forming an interconnection layer on the device layer opposite to the heat dissipation substrate, wherein opposite sidewalls of the heat dissipation substrate are aligned to opposite sidewalls of the device layer, and the opposite sidewalls of the device layer are aligned to opposite sidewalls of the interconnection layer in a cross-sectional view; and
   soldering the interconnection layer to the printed circuit board through the solder bumps, such that the heat dissipation substrate is farther from the printed circuit board than the device layer and the interconnection layer.

10. The method as claimed in claim 9, wherein the thermal conductivity of the heat dissipation substrate is between 200 $Wm^{-1}K^{-1}$ and 1200 $Wm^{-1}K^{-1}$.

11. The method as claimed in claim 9, wherein forming the heat dissipation substrate on the base substrate comprises performing a CVD process to form a dielectric material layer.

12. The method as claimed in claim 11, wherein the material of the dielectric material layer comprises BeO, BN, diamond, or a combination thereof.

13. The method as claimed in claim 9, wherein a thickness of the heat dissipation substrate is between 75 µm and 150 µm.

14. The method as claimed in claim 9, wherein heat generated by the device layer is dissipated through the heat dissipation substrate and away from the device layer in a first direction, and the heat generated by the device layer is dissipated through the interconnection layer on the device layer and away from the device layer in a second direction opposite to the first direction.

15. The method as claimed in claim 9, wherein removing the base substrate comprises performing a grinding process on the base substrate.

16. The method as claimed in claim 15, wherein the base substrate is completely removed after the grinding process.

17. A method of forming a semiconductor device mounted on a printed circuit board through solder bumps, comprising:

providing a base substrate;

forming a device layer on the base substrate, wherein the device layer comprises a transistor;

removing the base substrate; and attaching the device layer to a heat dissipation substrate after removing the base substrate only from the device layer, wherein a thermal conductivity of the heat dissipation substrate is greater than 200 $Wm^{-1}K^{-1}$;

forming an interconnection layer on the device layer opposite to the heat dissipation substrate, wherein opposite sidewalls of the heat dissipation substrate are aligned to opposite sidewalls of the device layer, and the opposite sidewalls of the device layer are aligned to opposite sidewalls of the interconnection layer in a cross-sectional view; and soldering the interconnection layer to the printed circuit board through the solder bumps, such that the heat dissipation substrate and the printed circuit board are disposed on opposite sides of the device layer.

18. The method as claimed in claim 17, wherein the heat dissipation substrate is formed of BeO, BN, diamond, or a combination thereof.

19. The method as claimed in claim 17, wherein removing the base substrate comprises:

holding the device layer with a carrier; and performing a grinding process to remove the base substrate completely.

20. The method as claimed in claim 19, wherein the carrier holds the device layer while the device layer is being attached to the heat dissipation substrate.

* * * * *